(12) United States Patent
Shin et al.

(10) Patent No.: US 12,733,148 B2
(45) Date of Patent: Sep. 8, 2026

(54) SEMICONDUCTOR MEMORY DEVICE AND METHOD OF MANUFACTURING THE SAME

(71) Applicant: SAMSUNG ELECTRONICS CO., LTD., Suwon-si (KR)

(72) Inventors: Seungmin Shin, Suwon-si (KR); Sangjun Park, Suwon-si (KR); Sungjoo An, Suwon-si (KR); Kijong Park, Suwon-si (KR); Ilyoung Yoon, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 328 days.

(21) Appl. No.: 18/474,394

(22) Filed: Sep. 26, 2023

(65) Prior Publication Data

US 2024/0251544 A1 Jul. 25, 2024

(30) Foreign Application Priority Data

Jan. 20, 2023 (KR) ........................ 10-2023-0008848

(51) Int. Cl.
*H10B 12/00* (2023.01)

(52) U.S. Cl.
CPC ........... *H10B 12/315* (2023.02); *H10B 12/05* (2023.02)

(58) Field of Classification Search
CPC .... H10B 12/315; H10B 12/05; H10B 12/482; H10B 12/30; H10B 12/03; H10B 12/488;
(Continued)

(56) References Cited

U.S. PATENT DOCUMENTS 10,790,396 B2 9/2020 Sawabe et al.
11,062,989 B2 7/2021 Sukekawa
(Continued)

FOREIGN PATENT DOCUMENTS

KR 10-2199223 1/2021
KR 10-2022-0155508 A 11/2022

OTHER PUBLICATIONS

Bobadilla, et al., "PMMA-Assisted Plasma Patterning of Graphene", in Journal of Nanotechnology, vol. 2018, Article ID 8349626, Aug. 23, 2018, https://doi.org/10.1155/2018/8349626, 9 pages.

*Primary Examiner* — Fernando L Toledo
*Assistant Examiner* — Shawn Shaw Muslim
(74) *Attorney, Agent, or Firm* — MORGAN, LEWIS & BOCKIUS LLP

(57) ABSTRACT

A semiconductor memory device according to an embodiment includes: a substrate; a bit line positioned on the substrate and extending in a first direction; a channel accommodating insulating layer positioned on the substrate, and defining a channel trench exposing the bit line and extending in a second direction crossing the first direction; a channel layer extending along a bottom surface and a side surface of the channel trench and contacting the bit line; a word line positioned in the channel trench and extending in the second direction; a gate insulating layer positioned between the channel layer and the word line; and a capacitor structure positioned on the channel layer and electrically connected to the channel layer, in which the channel layer has a double layer structure of an oxide semiconductor layer and a first graphene layer.

20 Claims, 13 Drawing Sheets

(58) Field of Classification Search
CPC .... H10B 12/033; H10D 30/63; H10D 62/124; H10D 62/235; H10D 62/80
See application file for complete search history.

(56) References Cited

U.S. PATENT DOCUMENTS

| | | | | |
|---|---|---|---|---|
| 11,121,258 | B2 | 9/2021 | Kula et al. | |
| 11,393,927 | B2 | 7/2022 | Lajoie et al. | |
| 12,016,176 | B2 * | 6/2024 | Jang | H10B 12/09 |
| 12,408,382 | B2 | 9/2025 | Cho et al. | |
| 2013/0015429 | A1 * | 1/2013 | Hong | H10D 62/882 257/29 |
| 2014/0272350 | A1 * | 9/2014 | Kim | C23C 16/26 427/430.1 |
| 2019/0035907 | A1 | 1/2019 | Ouerghi et al. | |
| 2020/0105892 | A1 | 4/2020 | Haratipour et al. | |
| 2020/0411686 | A1 | 12/2020 | Haratipour et al. | |
| 2021/0091120 | A1 | 3/2021 | Xie et al. | |
| 2022/0037504 | A1 | 2/2022 | Sills et al. | |
| 2024/0213352 | A1 * | 6/2024 | Torres Alonso | H10D 48/362 |

* cited by examiner

SEMICONDUCTOR MEMORY DEVICE AND METHOD OF MANUFACTURING THE SAME

CROSS-REFERENCE TO RELATED APPLICATION

This application claims priority to and the benefit of Korean Patent Application No. 10-2023-0008848 filed in the Korean Intellectual Property Office on Jan. 20, 2023, the entire contents of which are incorporated herein by reference.

BACKGROUND

1. Field

The described technology relates generally to a semiconductor memory device and a method of manufacturing the same, and more particularly, to a semiconductor memory device including a Vertical Channel Transistor (VCT) and a method of manufacturing the same.

2. Description of the Related Art

Since the degree of integration of a 2D or planar semiconductor memory device is mainly determined by the area occupied by a unit memory cell, the degree of integration is greatly affected by the level of fine pattern formation technology. As technology develops, the degree of integration increases, but the price of equipment increases accordingly, so there is a limit in reducing product prices.

In order to reduce the occupied area, semiconductor memory devices including vertical channel transistors having channels formed in a vertical direction have been proposed, and technical problems have arisen accordingly.

SUMMARY

The described technology has been made in an effort to improve the performance of a semiconductor memory device and reduce damage occurring when the device is manufactured.

A semiconductor memory device according to an embodiment includes: a substrate; a bit line on the substrate and extending in a first direction; a channel accommodating insulating layer positioned on the substrate, and defining a channel trench extending in a second direction crossing the first direction; a channel layer extending along a bottom surface and a side surface of the channel trench and contacting the bit line; a word line in the channel trench and extending in the second direction; a gate insulating layer separating the channel layer from the word line; and a capacitor structure on the channel layer and electrically connected to the channel layer, in which the channel layer has a double layer structure of an oxide semiconductor layer and a first graphene layer.

A semiconductor memory device according to another embodiment includes: a substrate; a bit line on the substrate and extending in a first direction; a word line on the substrate, electrically insulated from the bit line, and extending in a second direction crossing the first direction; a channel layer on the substrate, in electrical contact with the bit line, and insulated from the word line; and a capacitor structure electrically connected to the channel layer, in which the channel layer includes: an oxide semiconductor layer in electrical contact with the bit line; and a first graphene layer on the oxide semiconductor layer.

A method of manufacturing a semiconductor memory device according to another embodiment includes: forming a bit line extending in a first direction on a substrate; forming a channel accommodating insulating layer on the substrate to define a channel trench exposing at least a portion of the bit line and extending in a second direction crossing the first direction; stacking an oxide semiconductor layer on a substrate and the channel accommodating insulating layer; stacking a first graphene layer on the oxide semiconductor layer; forming a photoresist film on the first graphene layer; forming a channel layer by etching the first graphene layer and the oxide semiconductor layer by using the photoresist film as a mask; exposing the first graphene layer of the channel layer by removing the photoresist film; and forming a word line extending in the second direction, a gate insulating layer positioned between the channel layer and the word line, and a capacitor structure positioned on the channel layer and electrically connected to the channel layer.

Accordingly, it is possible to improve performance of a semiconductor memory device and reduce damage occurring during a manufacturing process.

DETAILED DESCRIPTION OF THE EMBODIMENTS

Figure 1:
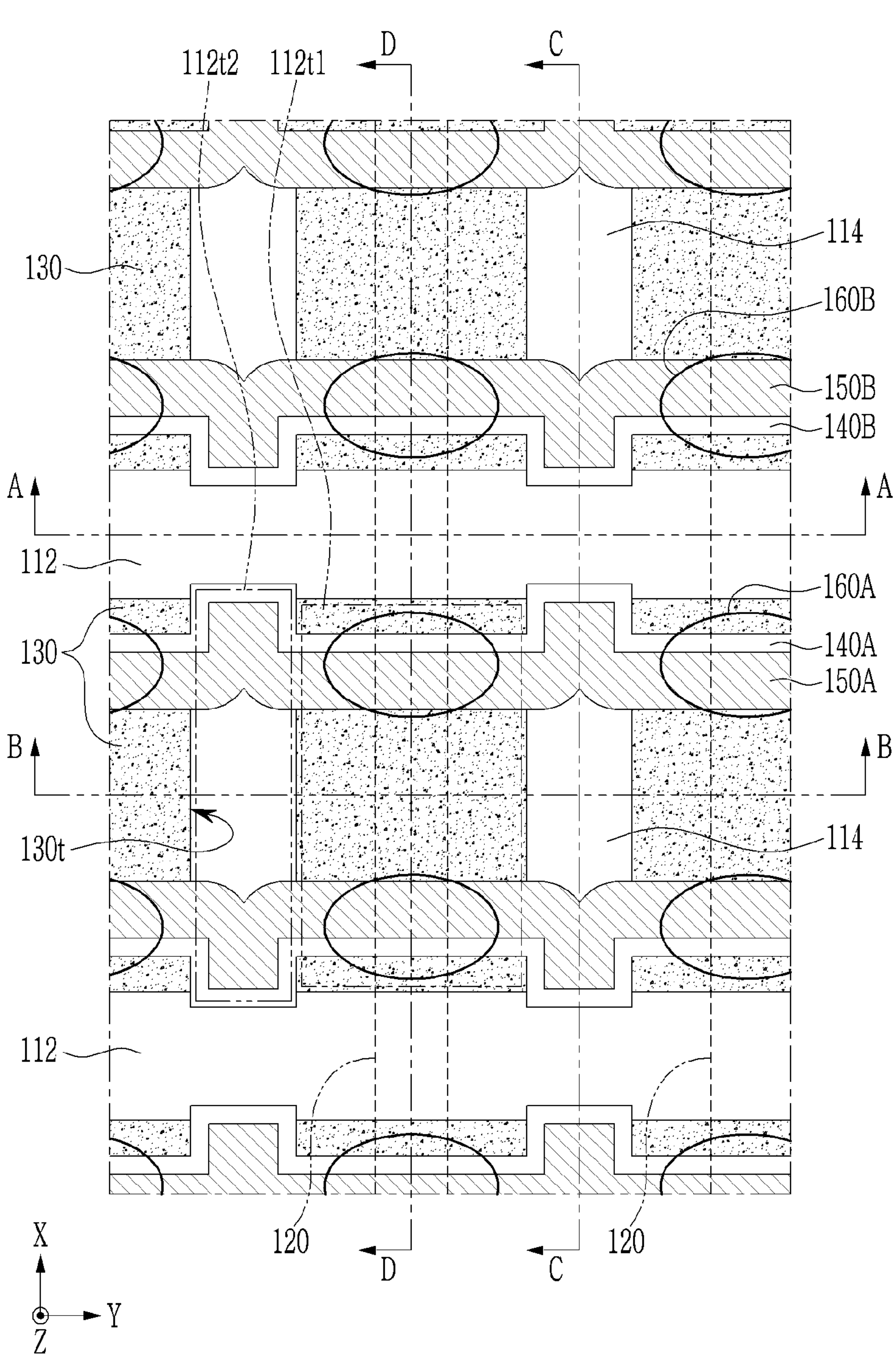
FIG. 1 is a layout diagram of a semiconductor memory device according to an embodiment.

Hereinafter, various embodiments will be described in detail with reference to the accompanying drawings. What will be described from now on is only an example of a semiconductor memory device and a method of manufacturing the same, and does not represent all embodiments that the present invention can implement. Structures and methods identical or equivalent to those described herein are included within the scope of the present invention. The same reference numerals are assigned to the same or similar components throughout the specification.

Figure 2:
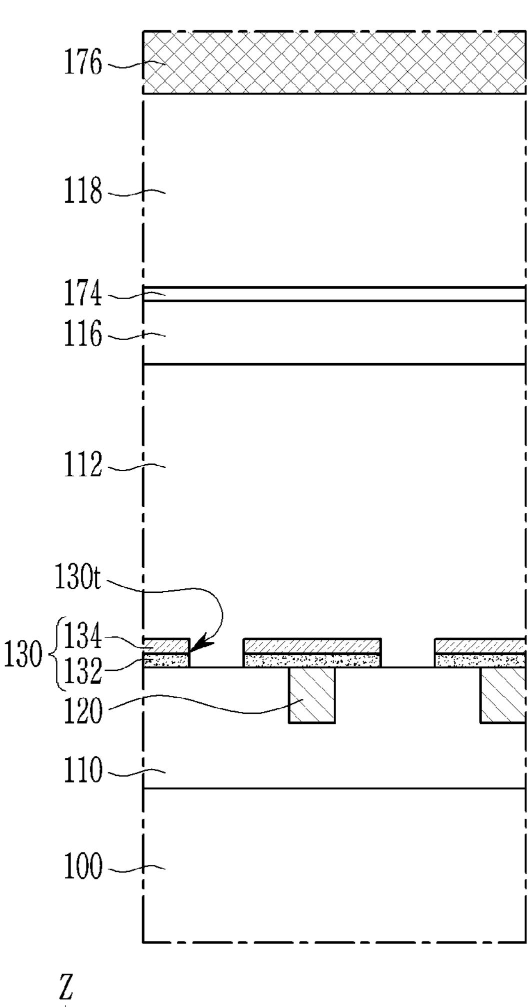
FIG. 2 is a cross-sectional view of the semiconductor memory device of FIG. 1 taken along line A-A.
Figure 3:
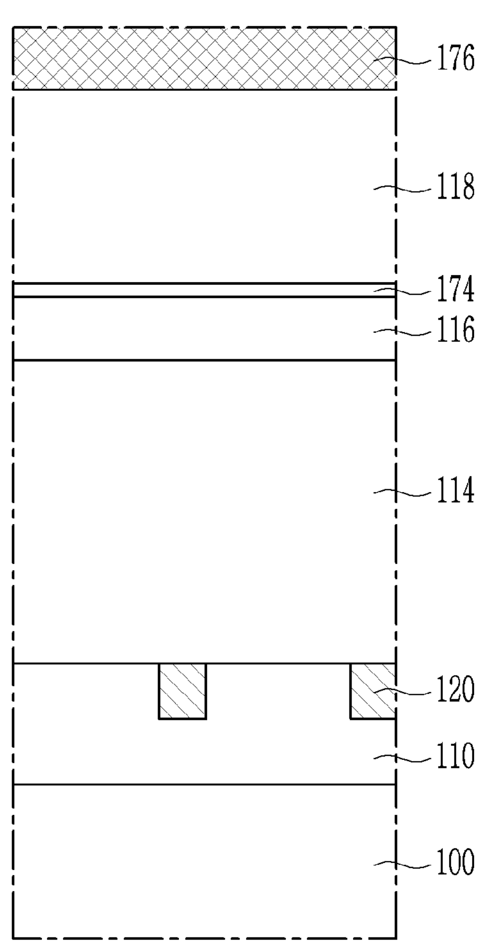
FIG. 3 is a cross-sectional view of the semiconductor memory device of FIG. 1 taken along line B-B.
Figure 3:
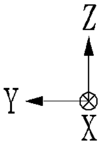
Figure 4:
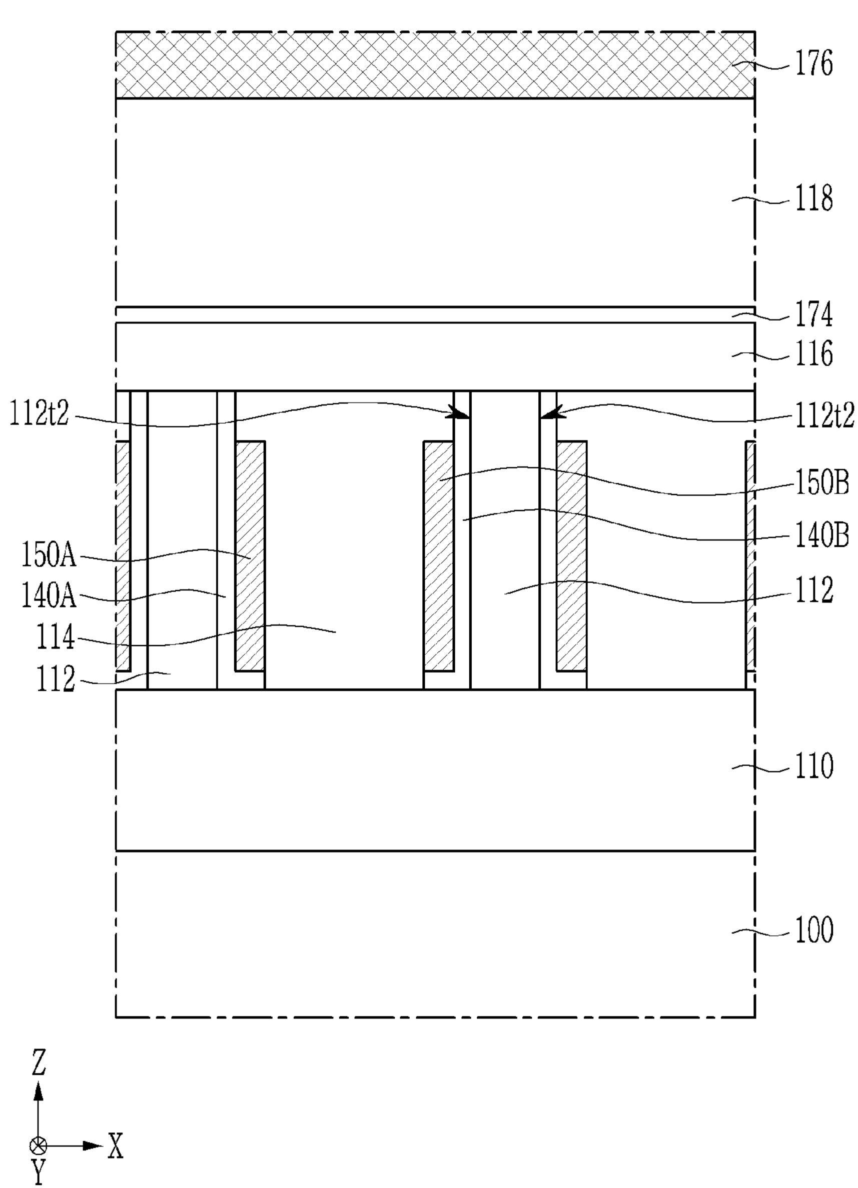
FIG. 4 is a cross-sectional view of the semiconductor memory device of FIG. 1 taken along line C-C.
Figure 5:
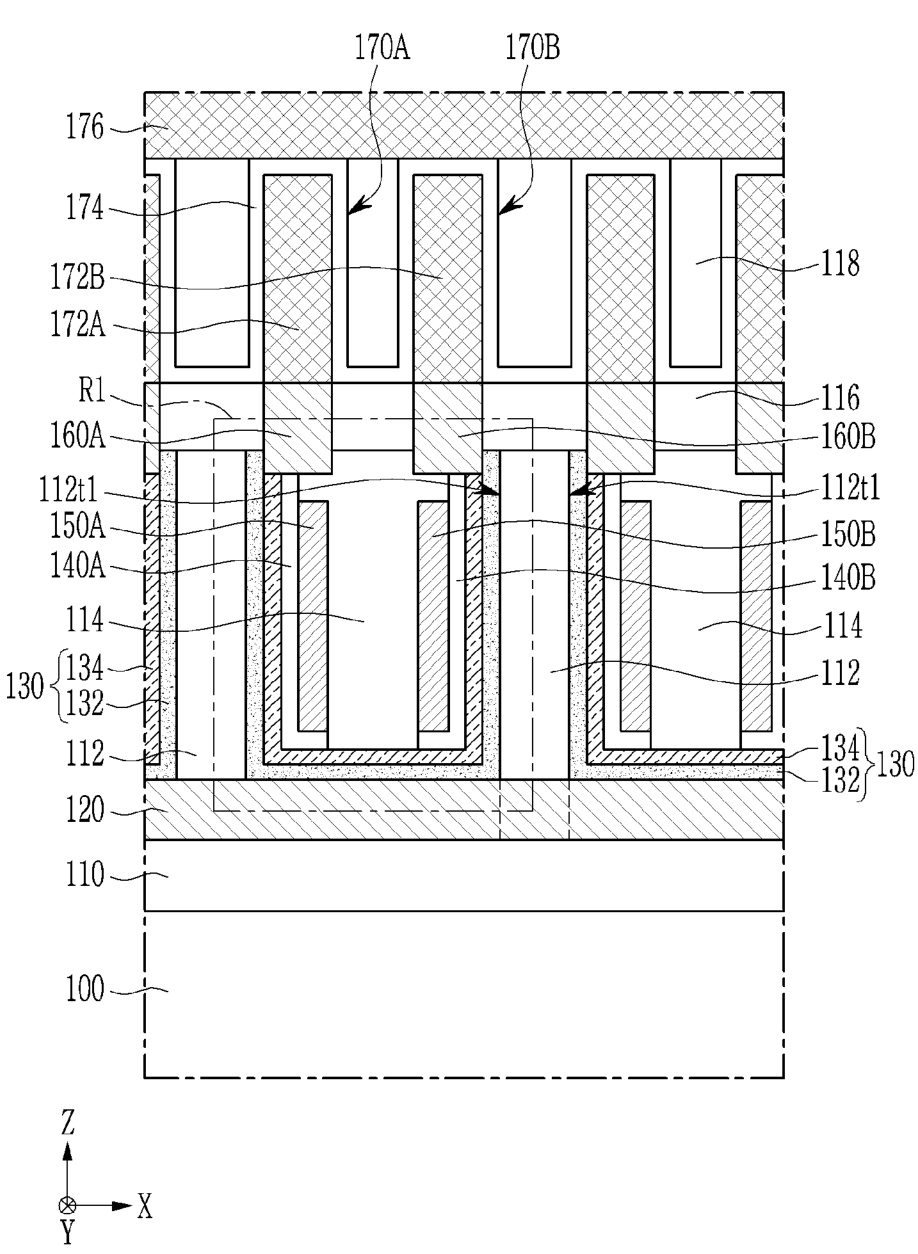
FIG. 5 is a cross-sectional view of the semiconductor memory device of FIG. 1 taken along line D-D.
Figure 6:
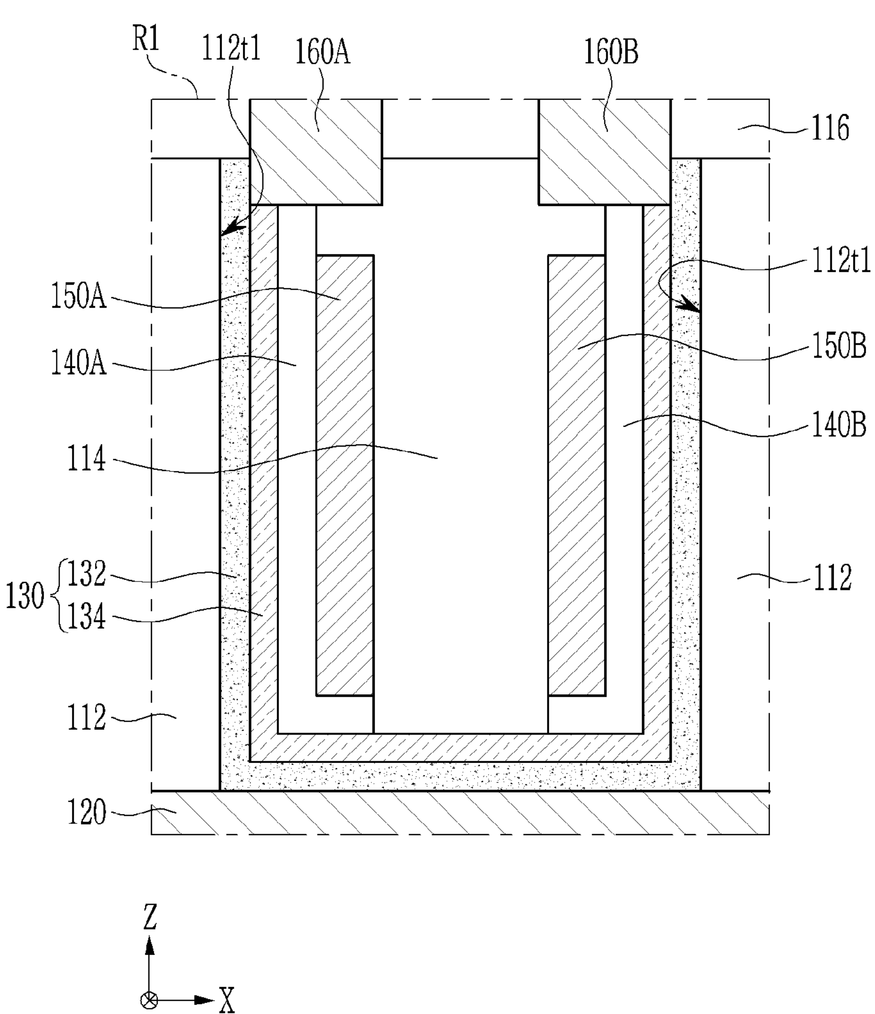
FIG. 6 is a diagram illustrating an example of an enlarged view of region R1 of FIG. 5.
Figure 7:
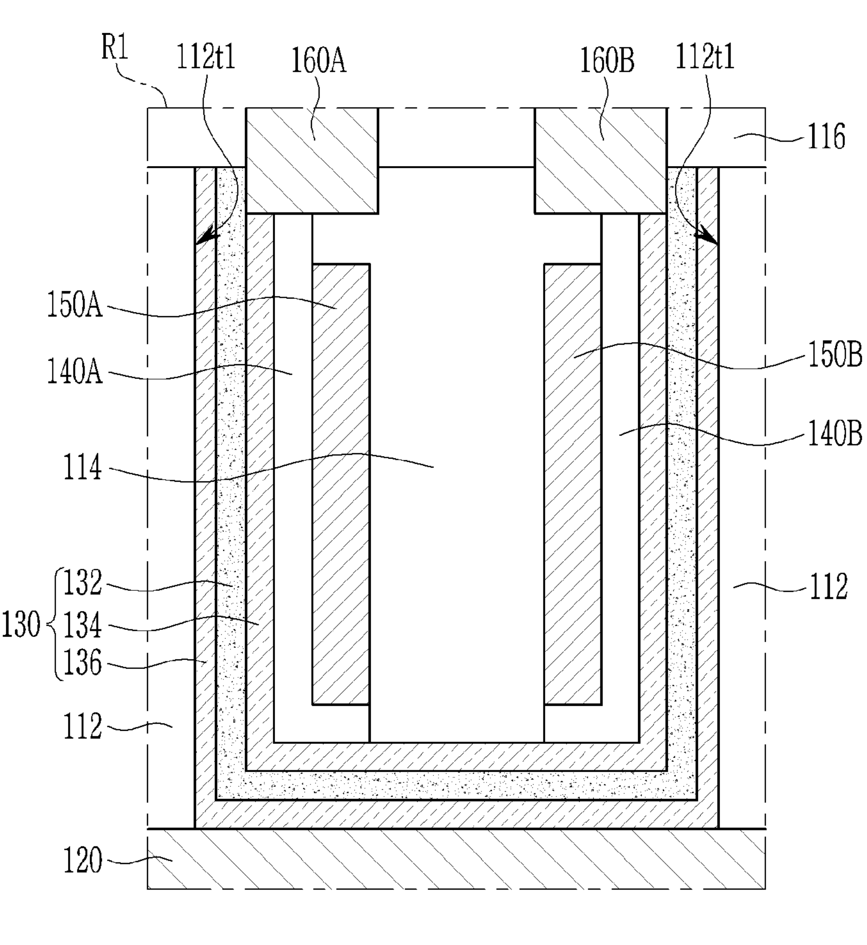
FIG. 7 is another example of an enlarged view of region R1 of FIG. 5.
Figure 7:
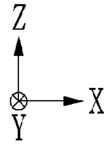

FIG. 1 is a layout diagram of a semiconductor memory device according to an embodiment, FIG. 2 is a cross-sectional view of the semiconductor memory device of FIG. 1 taken along line A-A, FIG. 3 is a cross-sectional view of the semiconductor memory device of FIG. 1 taken along line B-B, FIG. 4 is a cross-sectional view of the semiconductor memory device of FIG. 1 taken along line C-C, FIG. 5 is a cross-sectional view of the semiconductor memory device of FIG. 1 taken along line D-D, FIG. 6 is a diagram illustrating an example of an enlarged view of region R1 of FIG. 5, FIG. 7 is a diagram illustrating an another example of an enlarged view of region R1 of FIG. 5.

Referring to FIGS. 1 to 6, a semiconductor memory device according to an embodiment includes a substrate 100, a plurality of bit lines 120, a plurality of channel accommodating insulating layers 112, and a plurality of channel layer 130, a plurality of word lines 150A and 150B, gate insulating layers 140A and 140B, a charge insulating layer 114, a plurality of landing pads 160A and 160B, and capacitor structures 170A and 170B.

The substrate 100 may be made of silicon, gallium arsenide, silicon germanium, or the like, and may be a semiconductor on insulator (SOI) substrate.

The plurality of bit lines 120 may be positioned on the substrate 100, extend in a first direction X, and be substantially spaced apart from each other at uniform intervals in a second direction Y intersecting the first direction X, for example, at a right angle. The bit line 120 may also be positioned "directly on" the substrate 100, but, for example, the bit line 120 may be positioned on another layer, for example, the lower insulating layer 110, where the lower insulating layer 110 can be directly on the substrate 100. Where the bit lines 120 are positioned in the lower insulating layer 110, the lower insulating layer 110 may fill a space between the bit lines 120. In the present specification, "on" includes the case where another layer is sandwiched between two layers, whereas "directly on" means other layers are not interposed between the two specified layers, such that the two specified layers are in direct physical contact.

The bit line 120 may include metal, conductive metal nitride, conductive metal silicide, conductive metal oxide, doped polysilicon, or a combination thereof. For example, the bit line 120 may include TiN, Al, Cu, Ti, Ta, Ru, W, Mo, Pt, Ni, Co, TaN, WN, NbN, TiAl, TiAlN, TiSi, TiSiN, TaSi, TaSiN, RuTiN, NiSi, CoSi, IrOx, RuOx, doped polysilicon, or a combination thereof, but is not limited thereto. The bit line 120 may also include a single layer or multiple layers of these conductive materials.

The plurality of channel accommodating insulating layers 112 may be positioned above the substrate 100, for example, above the lower insulating layer 110, extend in the second direction Y, and be spaced apart at uniform intervals in the first direction X, see for example, FIG. 4. The space between the channel accommodating insulating layers 112 constitutes channel trenches 112*t*1 and 112*t*2, where channel trenches 112*t*2 are narrowed by gate insulating layers 140A and 140B extending outward from sidewalls of the channel layer 130, and the channel trenches 112*t*1 and 112*t*2 may extend in the second direction Y like the channel accommodating insulating layer 112 and be arranged in the first direction X at uniform intervals. The channel trenches 112*t*1 and 112*t*2 may have a first portion 112*t*1 and a second portion 112*t*2 that are alternately disposed, where the first portion 112*t*1 may be wider than the second portion 112*t*2, which may be narrower.

The channel trenches 112*t*1 and 112*t*2, for example, the first portion 112*t*1, may overlap a portion of bit line 120. For example, a portion of a top surface of the bit line 120 may overelap the first portion 112*t*1 in the third direction Z.

The channel accommodating insulating layer 112 is an insulator and may include, for example, at least one of silicon oxide, silicon oxynitride, silicon nitride, and a low-k material having a smaller dielectric constant than that of silicon oxide, but is not limited thereto. The low-k material may be, for example, at least one of Flowable Oxide (FOX), Torene SilaZene (TOSZ), Undoped Silica glass (USG), Borosilica glass (BSG), PhosphoSilica glass (PSG), BoroPhosphoSilica glass (BPSG), Plasma Enhanced tetra-ethyl Ortho Silicate (PETEOS), Fluoride silicate glass (FSG), Carbon Doped silicon Oxide (CDO), Xerogel, Aerogel, Amorphous Fluorinated Carbon, Organo silicate glass (OSG), Parylene, bis-benzocyclobutenes (BCB), SiLK, polyimide, porous polymeric material, and a combination thereof, but is not limited thereto.

The channel layer 130 may include an oxide semiconductor layer 132 and a graphene layer 134 thereon, such that the channel layer 130 has a double layer structure of the oxide semiconductor layer 132 and a first graphene layer 134. The channel layer 130 may be positioned in the channel trenches 112*t*1 and 112*t*2 made of the channel accommodating insulating layer 112 and formed in the form of a thin film along the surface of the first portion 112*t*1 of the channel trench. For example, the channel layer 130 may be positioned on the bottom surface and side surface of the first portion 112*t*1 of the channel trench. The oxide semiconductor layer 132 can be in physical and electrical contact with the bit line 120.

A portion of the channel layer 130 may physically contact and be electrically connected to the bit line 120 exposed in the first portion 112*t*1 of the channel trench. A portion of the channel layer 130 may physically contact the top surface of the bit line 120 along the lower surface of the first portion 112*t*1 of the channel trench.

Referring to FIGS. 1 and 2, the channel layer 130 adjacent in the second direction Y may define a separation groove 130*t*, where the channel layer 130 extending in the second direction Y may be cut. The separation groove 130*t* extends in the first direction X and may be viewed as cutting the channel layer 130 extending in the second direction Y within the first portion 112*t*1 of the channel trench. Accordingly, each channel layer 130 becomes an isolated island shape, and a plurality of channel layers 130 may be arranged in a matrix form.

The channel layer 130 may include a first source/drain region and a second source/drain region arranged in a vertical direction (for example, a third direction Z crossing the first direction X and the second direction Y). For example, a lower portion of the channel layer 130 may function as a first source/drain region, and an upper portion of the channel layer 130 may function as a second source/drain region, and a portion of the channel layer 130 between the first source/drain region and the second source/drain region may function as a channel region.

The channel layer 130 may include an oxide semiconductor layer 132 and a graphene layer 134 thereon. The oxide semiconductor layer 132 may include, for example, amorphous indium gallium zinc oxide (IGZO), indium gallium silicon oxide ($In_xGa_ySi_zO$, IGSO), indium tin zinc oxide ($In_xSn_yZn_zO$, ITZO), indium gallium tin oxide ($In_xGa_ySn_zO$, IGTO), indium zinc oxide ($In_xZn_yO$, IZO), zinc oxide (ZnO, ZnO), zinc tin oxide ($Zn_xSn_yO$, ZTO), zinc oxynitride ($Zn_xO_yN$, ZnON), zirconium zinc tin oxide ($Zr_xZn_ySn_zO$, ZZTO), tin oxide ($Sn_xO$, SnO), hafnium indium zinc oxide ($Hf_xIn_yZn_zO$, HIZO), gallium zinc tin oxide ($Ga_xZn_ySn_zO$, GZTO), aluminium zinc tin oxide ($Al_xZn_ySn_zO$. AZTO), ytterbium gallium zinc oxide ($Yb_xGa_yZn_zO$, YGZO), indium gallium oxide ($In_xGa_yO$, IGO), or a combination thereof.

The graphene layer 134 has good compatibility with an oxide semiconductor, for example, amorphous IGZO, and may maintain electrical characteristics of the channel layer 130 even with a small thickness. For example, the thickness of the graphene layer 134 may be a thickness of 1 to 6 graphene mono-layers, that is, about 0.3 nm to about 2 nm, and this thickness hardly affects the overall size of the device while maintaining the electrical characteristics of the channel layer 130.

In embodiments, by placing the graphene layer 134 having strong chemical resistance on the oxide semiconductor layer 132 as described above, the damage to the oxide semiconductor layer 132, which may occur when the photoresist film used for etching the channel layer 130 is removed, may be prevented.

According to another embodiment, the channel layer 130 may further include, a lower (e.g., second) graphene layer 136 positioned between the oxide semiconductor layer 132 and the channel accommodating insulating layer 112, and between the oxide semiconductor layer 132 and at least a portion of the bit line 120, as illustrated in FIG. 7, in addition to the oxide semiconductor layer 132 and the upper (e.g., first) graphene layer 134 thereon. The lower graphene layer 136 can be under the oxide semiconductor layer 132. In this way, when the lower graphene layer 136 is located under the oxide semiconductor layer 132, the lower graphene layer 136 comes into physical and electrical contact with the bit line 120. Accordingly, galvanic corrosion that may occur with the oxide semiconductor layer 132 and the bit line 120, for example, amorphous IGZO and TiN, directly in contact with each other, may be reduced. The thickness of the lower graphene layer 136 may also be about 0.3 nm to about 2 nm. The lower graphene layer 136 may have a different thickness than the upper graphene layer 134, where a thickness of each of the first (e.g., upper) and second (e.g., lower) graphene layers is about 0.3 nm to about 2 nm.

According to another embodiment, the upper graphene layer 134 of FIG. 7 may be omitted in the channel layer 130.

The word lines 150A and 150B may be formed in the channel trenches 112*t*1 and 112*t*2 and extend in the second direction Y to cross the bit line 120. The plurality of word lines 150A and 150B may include a first word line 150A and a second word line 150B spaced apart from each other in the first direction X, and a pair of first word line 150A and the second word line 150B may face each other within one channel trench 112*t*1 or 112*t*2. For example, a pair of first word lines 150A and second word lines 150B may be formed on two opposite sides of the channel trenches 112*t*1 and 112*t*2, and the first word line 150A may be positioned on a first lateral surface, and the second word line 150B may be positioned on a second lateral surface of the channel trenches 112*t*1 and 112*t*2. In this way, two transistor structures may be implemented per one channel layer 130.

Each of the word lines 150A and 150B may include doped polysilicon, metal, conductive metal nitride, conductive metal silicide, conductive metal oxide, or a combination thereof. For example, each of the word lines 150A and 150B may include doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or a combination thereof, but is not limited thereto.

Gate insulating layers 140A and 140B may be interposed between the channel layer 130 and the word lines 150A and 150B, where the gate insulating layers 140A and 140B can physically and electrically separate the channel layer 130 from the word lines 150A and 150B. The gate insulating layers 140A and 140B may be formed, for example, along the surface of the channel layer 130 and along bottom and side surfaces of the word lines 150A and 150B.

The gate insulating layers 140A and 140B may include a first gate insulating layer 140A and a second gate insulating layer 140B separated from each other in the first direction X by charge insulating layer 114. The first gate insulating layer 140A may be interposed between the channel layer 130 and the first word line 150A, and the second gate insulating layer 140B may be interposed between the channel layer 130 and the second word line 150B. A pair of first gate insulating layers 140A and second gate insulating layers 140B may face each other within one channel trench 112*t*1 and 112*t*2, and for example, the first gate insulating layer 140A may be formed along the first lateral surfaces of the channel trenches 112*t*1 and 112*t*2, and the second gate insulating layer 140B may be formed along the second lateral surfaces of the channel trenches 112*t*1 and 112*t*2.

The gate insulating layers 140A and 140B may include silicon oxide, silicon oxynitride, a high-k material having a higher dielectric constant than that of silicon oxide, or a combination thereof. Examples of high-k materials may include hafnium oxide (HfO2), hafnium silicon oxide (HfSiO), hafnium silicon oxynitride (HfSiON), haftium tantalum oxide (HfTaO), hafnium titanium oxide (HfTiO), hafnium zirconium oxide (HfZrO), zirconium oxide (ZrO2), aluminum oxide (Al2O3), or a combination thereof, but the high-k material is not limited thereto.

The first gate insulating layer 140A and the second gate insulating layer 140B may be formed by the same manufacturing process. The first word line 150A and the second word line 150B may be formed by the same manufacturing process. The first gate insulating layer 140A and the second gate insulating layer 140B may have the same material composition, and the first word line 150A and the second word line 150B may have the same material composition.

The charge insulating layer 114 may be formed in the channel trenches 112*t*1 and 112*t*2. The charge insulating layer 114 may fill a space of the channel trenches 112*t*1 and 112*t*2 which remains after the channel layer 130, the gate insulating layers 140A and 140B, and the word lines 150A and 150B have been formed. In addition, the charge insulating layer 114 may fill the separation groove 130*t* between the channel layers 130 adjacent in the second direction Y. For a clear understanding of the drawings, the charge insulating layer 114 is not illustrated in FIG. 1.

The charge insulating layer 114 may include, for example, at least one of silicon oxide, silicon oxynitride, silicon nitride, and a low-k material having a smaller dielectric constant than that of silicon oxide, but is limited thereto.

The landing pads 160A and 160B may be positioned on the channel accommodating insulating layer 112 and the charge insulating layer 114. The landing pads 160A and 160B may be electrically connected to opposite ends of the channel layer 130. For example, a first interlayer insulating layer 116 may be formed on the channel accommodating insulating layer 112 and the charge insulating layer 114. The landing pads 160A and 160B may pass through the first interlayer insulating layer 116 and be electrically connected to an upper portion of the channel layer 130, where the landing pads 160A and 160B may be in physical and electrical contact with a sidewall of the oxide semiconductor layer 132 and an endwall of the upper graphene layer 134. An upper surface of the first interlayer insulating layer 116 may be disposed at the same level as the top surfaces of the landing pads 160A and 160B, where the upper surface of the first interlayer insulating layer 116 and the top surfaces of the landing pads 160A and 160B can be coplanar.

Each of the landing pads 160A and 160B may overlap at least a portion of the channel layer 130 in the vertical direction (for example, in the third direction Z). The plurality of landing pads 160A and 160B may have an island shape spaced apart from each other in the first direction X and the second direction Y, and may be arranged in a matrix form.

The landing pads 160A and 160B may include a first landing pad 160A and a second landing pad 160B spaced apart from each other in the first direction X. The first landing pad 160A may contact one end of the channel layer 130 adjacent to the first word line 150A, and the second landing pad 160B may contact the other end of the channel layer 130 adjacent to the second word line 150B. In the drawing, it is illustrated that the first landing pad 160A overlaps the first word line 150A in the third direction Z, and the second landing pad 160B overlaps the second word line 150B in the third direction Z, but this is just one example.

Each of the landing pads 160A and 160B may contact at least a portion of a side surface of the channel layer 130. In this case, a contact area between each of the landing pads 160A and 160B and the channel layer 130 may increase, thereby reducing interface resistance. For example, as illustrated, each of the landing pads 160A and 160B may contact the side surface (sidewall) of the oxide semiconductor layer 132 and the top surface (endwall) of the graphene layer 134.

Each of the landing pads 160A and 160B may include doped polysilicon, metal, conductive metal nitride, conductive metal silicide, conductive metal oxide, or a combination thereof. For example, each of the landing pads 160A and 160B may include doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx or a combination thereof, but is not limited thereto.

The capacitor structures 170A and 170B may be formed over the landing pads 160A and 160B. The capacitor structures 170A and 170B may include lower electrodes 172A and 172B, a capacitor dielectric layer 174, and an upper electrode 176, respectively. The capacitor structures 170A and 170B may be arranged to correspond to the landing pads 160A and 160B, where the lower electrodes 172A and 172B can be vertically aligned with landing pads 160A and 160B, respectively. The landing pads 160A and 160B may electrically connect the channel layer 130 with the capacitor structures 170A and 170B. The capacitor structures 170A and 170B may store charge by using a potential difference generated between the lower electrodes 172A and 172B and the upper electrode 176 across the capacitor dielectric layer 174.

The lower electrodes 172A and 172B may be electrically connected to the landing pads 160A and 160B, respectively. Each of the lower electrodes 172A and 172B may have a pillar shape extending in the vertical direction (for example, the third direction Z), but is not limited thereto. The lower electrodes 172A and 172B may overlap the landing pads 160A and 160B in the vertical direction (for example, the third direction Z). For example, the plurality of lower electrodes 172A and 172B may be arranged in a matrix form in an island shape spaced apart from each other in the first direction X and the second direction Y.

The lower electrodes 172A and 172B may include a first lower electrode 172A and a second lower electrode 172B spaced apart from each other in the first direction X. The first lower electrode 172A may contact the upper surface of the first landing pad 160A, and the second lower electrode 172B may contact the upper surface of the second landing pad 160B. Accordingly, the capacitor structures 170A and 170B may include a first capacitor structure 170A and a second capacitor structure 170B arranged along the first direction X.

The capacitor dielectric layer 174 may be interposed between the lower electrodes 172A and 172B and the upper electrode 176. For example, the capacitor dielectric layer 174 may extend along surfaces of the lower electrodes 172A and 172B and an upper surface of the first interlayer insulating layer 116. The upper electrode 176 may be formed on a top surface of the capacitor dielectric layer 174.

The upper electrode 176 may be a plate-shaped structure extending along a plane crossing the third direction Z. For example, a second interlayer insulating layer 118 may be formed on the capacitor dielectric layer 174 to fill a space between the lower electrodes 172A and 172B. The top surface of the second interlayer insulating layer 118 may be disposed at the same level as an uppermost surface of the capacitor dielectric layer 174. The upper electrode 176 may extend along the upper surface of the capacitor dielectric layer 174 and the upper surface of the second interlayer insulating layer 118. However, this is only one example, and the second interlayer insulating layer 118 may be omitted. As another example, unlike the illustration, the upper electrode 176 may be formed on the capacitor dielectric layer 174 to fill a space between the lower electrodes 172A and 172B.

Each of the lower electrodes 172A, and 172B and the upper electrode 176 may include doped polysilicon, metal, conductive metal nitride, conductive metal silicide, conductive metal oxide, or a combination thereof. For example, each of the lower electrodes 172A, and 172B and the upper electrode 176 may include doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or a combination thereof, but is not limited thereto.

The capacitor dielectric layer 174 may include silicon oxide, silicon oxynitride, a high-k material having a higher dielectric constant than silicon oxide, or a combination thereof. Examples of the high-k material may include hafnium oxide (HfO2), hafnium silicon oxide (HfSiO), hafnium silicon oxynitride (HfSiON), haftium tantalum oxide (HfTaO), hafnium titanium oxide (HfTiO), hafnium zirconium oxide (HfZrO), zirconium oxide (ZrO2), aluminum oxide (Al2O3), or a combination thereof, but the high-k material is not limited thereto.

A method of manufacturing a semiconductor memory device according to an embodiment will be described with reference to FIGS. 1 to 13.

FIGS. 8 to 13 are cross-sectional diagrams of intermediate processes in a method of manufacturing a semiconductor memory device according to an embodiment, and the left side of each figure shows an intermediate operation of FIG. 5, that is, a cross section taken along the line D-D in FIG. 1, and the right side shows an intermediate operation of FIG. 4, that is, a cross section taken along the line C-C in FIG. 1.

Figure 8:
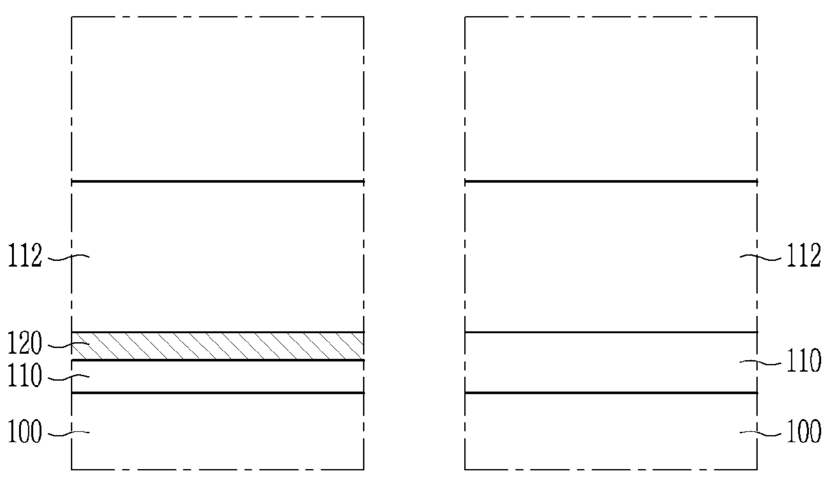
FIGS. 8 to 13 are cross-sectional diagrams of intermediate processes in a method of manufacturing a semiconductor memory device according to an embodiment.
Figure 8:
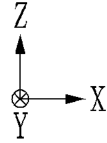

Referring to FIG. 8, a lower insulating layer 110 can be formed on a substrate 100 and a bit line 120 can be formed thereon, where the left side of the figure shows a cross section taken along the line D-D in FIG. 1, and the right side shows a cross section taken along the line C-C in FIG. 1. As described above, the plurality of bit lines 120 may extend in the first direction X and may be spaced apart in the second direction Y crossing the first direction X, where the bit lines 120 may be spaced apart at equal intervals.

A channel accommodating insulating layer 112 can be formed on the lower insulating layer 110. In this case, the channel accommodating insulating layer 112 may cover at least a portion of the upper surface of the lower insulating layer 110 and at least a portion of the upper surface of the bit line 120.

Figure 9:
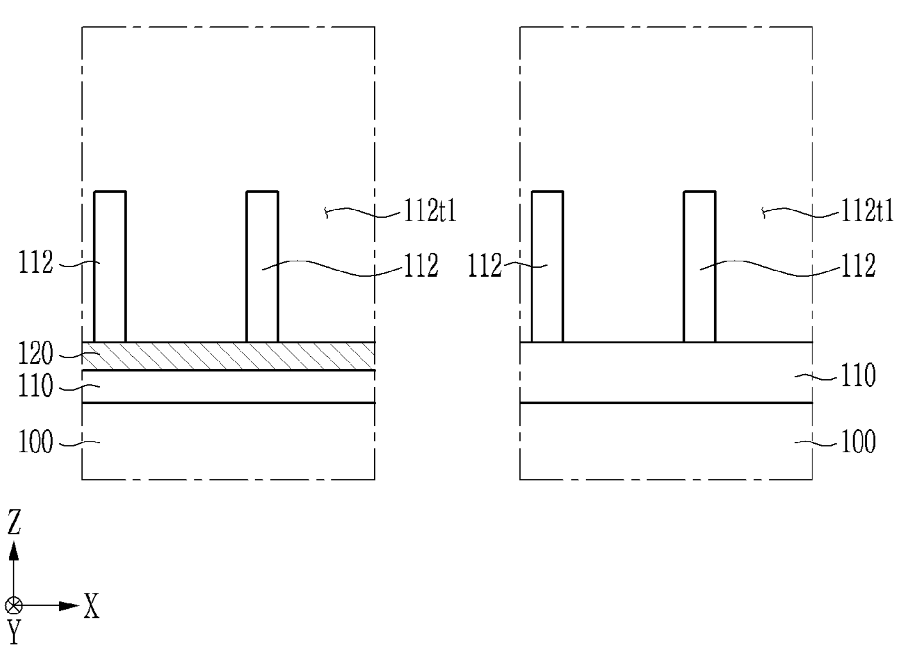

Referring to FIG. 9, a plurality of first portions of channel trenches **112*t*1 can be formed in the channel accommodating insulating layer 112, where portions of the channel accommodating insulating layer 112 can be removed to form spaces between the remaining channel accommodating insulating layers 112 constituting the channel trenches 112*t*1. The plurality of first portions of channel trenches 112*t*1 may extend in the second direction Y and cross the bit line 120, where the remaining portions of channel accommodating insulating layer 112 may be disposed at uniform intervals in the first direction X. A portion of an upper surface of the bit line 120 may be exposed by removal of the portion of the channel accommodating insulating layer 112, where the bit line 120 may be exposed at the bottom of the channel trenches 112*t*1**.

Figure 10:
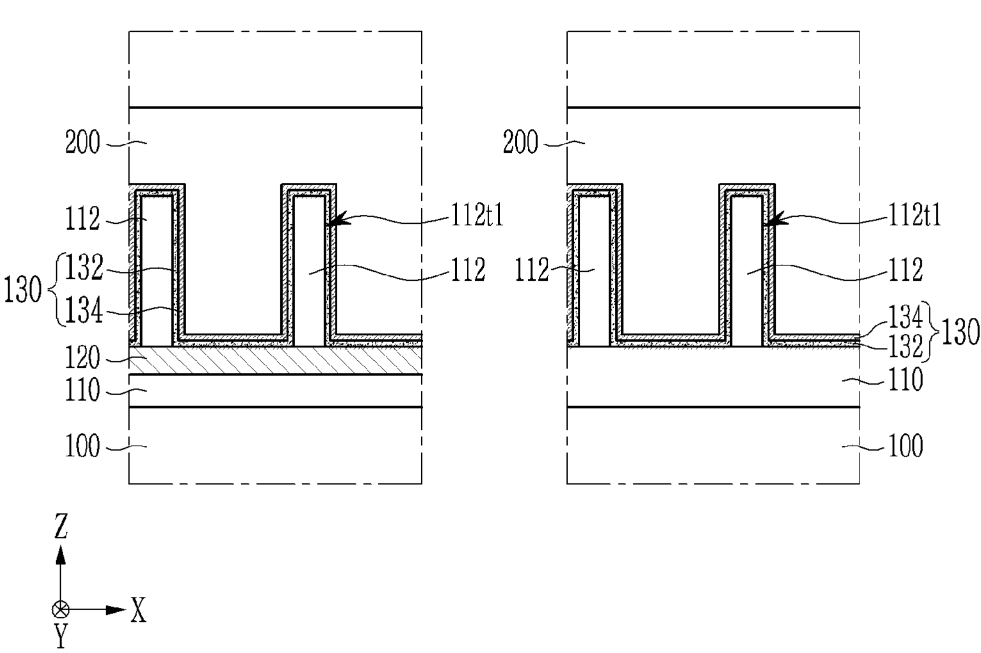

Referring to FIG. 10, an oxide semiconductor layer 132 and a graphene layer 134 can be sequentially stacked on the exposed surfaces of the bit line 120, channel accommodating insulating layer 112, and lower insulating layer 110. A photoresist film 200 for forming a mask for patterning the oxide semiconductor layer 132 and the graphene layer 134 can be stacked thereon. The photoresist film 200 can be formed on the graphene layer 134.

Figure 11:
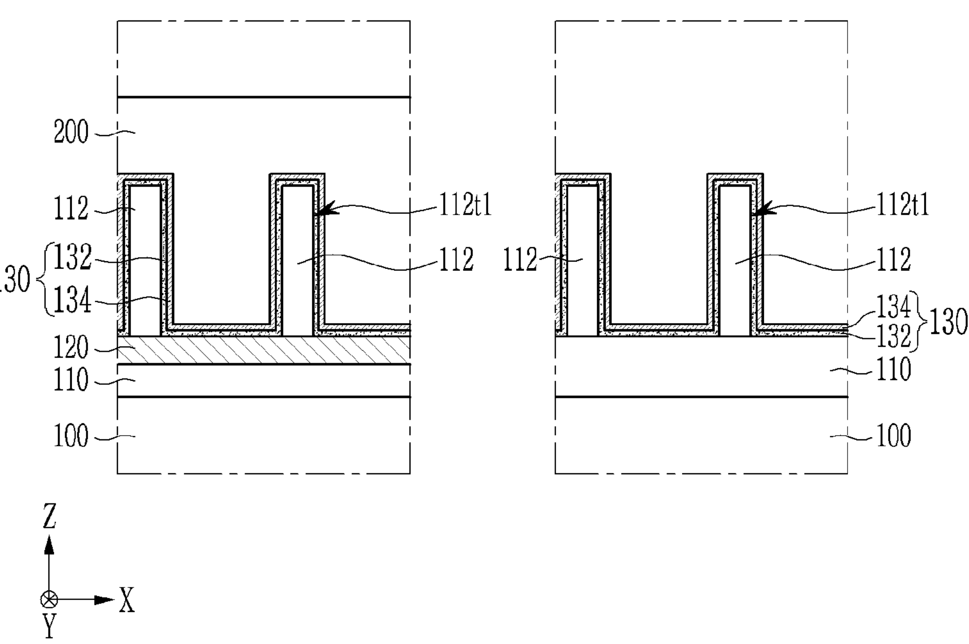

Referring to FIG. 11, one or more portions of the photoresist film 200 can be removed to form a mask that exposes underlying portions of the graphene layer 134, where the portions of the photoresist film 200 can be removed from regions overlying the lower insulating layer 110, and remain on regions overlying the bit line 120. The portion of the photoresist film 200 on the portion where the oxide semiconductor layer 132 and the graphene layer 134 are to remain can be left as it is, and the portion of the photoresist film 200 on the portion where the oxide semiconductor layer 132 and the graphene layer 134 are to be removed is removed. The channel layer 130 can be formed by etching the first graphene layer 134 and the oxide semiconductor layer 132 by using the photoresist film as a mask.

Figure 12:
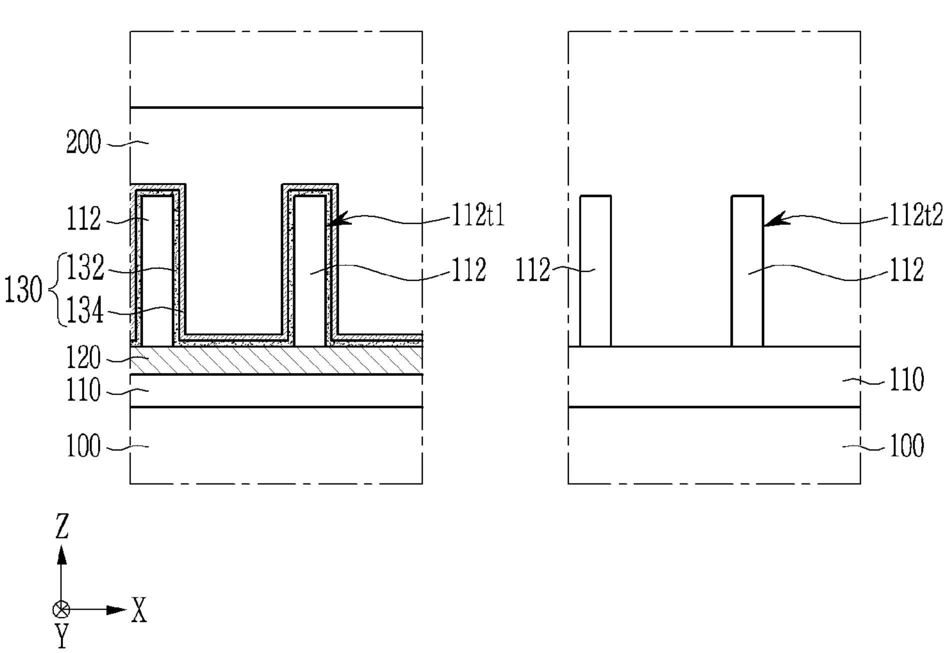

Referring to FIG. 12, the exposed portions of the graphene layer 134 and the underlying oxide semiconductor layer 132 can be removed, where the graphene layer 134 and the oxide semiconductor layer 132 can be removed by etching. The oxide semiconductor layer 132 may be removed by various dry and wet etching methods, and the graphene layer 134 may be removed by $O_2$ plasma or the like, where the graphene layer 134 and the oxide semiconductor layer 132 can be selectively removed by sequential processes. Removal of the graphene layer 134 and the underlying oxide semiconductor layer 132 can expose at least portions of the lower insulating layer 110 and the channel accommodating insulating layer 112.

Figure 13:
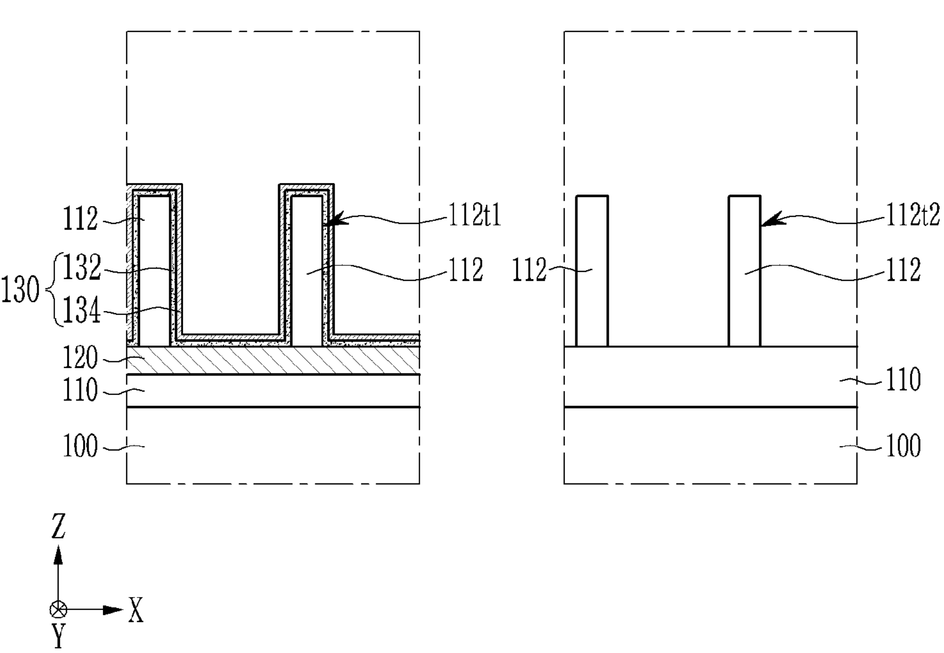

Referring to FIG. 13, the remaining portion of the photoresist film 200 can be removed, where the remaining portion of the photoresist film 200 may be removed by selective etching. A strong acidic solution, such as sulfuric acid or HF, can be used to selectively remove the photoresist film 200, where the graphene layer 134 can provide an acid resistant layer that protects the oxide semiconductor layer, for example, IGZO. Because the graphene layer 134 is resistant to the strong acid used to etch the photoresist film 200, and the graphene layer 134 covers the oxide semiconductor layer 132 (e.g., IGZO), the graphene layer 134 can prevent damage to the oxide semiconductor layer 132 during etching. Removal of the remaining portion of the photoresist film 200 can expose the underlying portions of the graphene layer 134. The surfaces of first channel trenches **112*t*1 can be covered by channel layer 130, where the graphene layer 134** can form the exposed surface.

As in the case of FIG. 7, when the channel layer 130 is made of a triple layer, the lower graphene layer 136, the oxide semiconductor layer 132, and the graphene layer 134 may be sequentially stacked, and the three layers may be patterned using sequential selective etching.

Finally, referring to FIGS. 1 to 6, structures on the channel layer 130 are formed.

Although several embodiments have been described above, these are only examples and the scope of the present invention is not limited thereto.

While this disclosure has been described in connection with what is presently considered to be practical embodiments, it is to be understood that the invention is not limited to the disclosed embodiments. On the contrary, it is intended to cover various modifications and equivalent arrangements included within the spirit and scope of the appended claims.

What is claimed is:

1. A semiconductor memory device, comprising:
- a substrate;
- a bit line on the substrate and extending in a first direction;
- a channel accommodating insulating layer positioned on the substrate, and defining a channel trench extending in a second direction crossing the first direction;
- a channel layer extending along a bottom surface and a side surface of the channel trench and contacting the bit line;
- a word line in the channel trench and extending in the second direction;
- a gate insulating layer separating the channel layer from the word line; and
- a capacitor structure on the channel layer and electrically connected to the channel layer,
- wherein the channel layer has a double layer structure of an oxide semiconductor layer and a first graphene layer, and
- wherein, in a stacking direction perpendicular to the first direction, a portion of the first graphene layer is stacked on a portion of the oxide semiconductor layer which is stacked on a portion of the bit line.

2. The semiconductor memory device of claim 1, wherein:
- the channel layer further includes a second graphene layer, and
- the oxide semiconductor layer is interposed between the first graphene layer and the second graphene layer.

3. The semiconductor memory device of claim 2, wherein:
- the oxide semiconductor layer includes amorphous indium gallium zinc oxide (IGZO).

4. The semiconductor memory device of claim 2, wherein:
- a thickness of each of the first and second graphene layers is about 0.3 nm to about 2 nm.

5. The semiconductor memory device of claim 1, wherein:
- a first surface of the oxide semiconductor layer is in electrical contact with the bit line, and
- a second surface opposite to the first surface of the oxide semiconductor layer is in electrical contact with the first graphene layer.

6. The semiconductor memory device of claim 5, wherein:
- the oxide semiconductor layer includes amorphous indium gallium zinc oxide (IGZO).

7. The semiconductor memory device of claim 5, wherein:
- a thickness of the first graphene layer is about 0.3 nm to about 2 nm.

8. A semiconductor memory device, comprising:
- a substrate;
- a bit line on the substrate and extending in a first direction;

a word line on the substrate, electrically insulated from the bit line, and extending in a second direction crossing the first direction;

a channel layer on the substrate, in electrical contact with the bit line, and insulated from the word line; and a capacitor structure electrically connected to the channel layer, wherein the channel layer includes:

an oxide semiconductor layer in electrical contact with the bit line; and a first graphene layer on the oxide semiconductor layer, and wherein, in a stacking direction perpendicular to the first direction, a portion of the first graphene layer is stacked on a portion of the oxide semiconductor layer which is stacked on a portion of the bit line.

9. The semiconductor memory device of claim 8, wherein:

the channel layer further includes a second graphene layer, and the oxide semiconductor layer is interposed between the first graphene layer and the second graphene layer.

10. The semiconductor memory device of claim 9, wherein:

the oxide semiconductor layer includes amorphous indium gallium zinc oxide (IGZO).

11. The semiconductor memory device of claim 9, wherein:

a thickness of each of the first and second graphene layers is about 0.3 nm to about 2 nm.

12. The semiconductor memory device of claim 8, wherein:

the oxide semiconductor layer includes amorphous indium gallium zinc oxide (IGZO).

13. The semiconductor memory device of claim 8, wherein:

a thickness of the first graphene layer is about 0.3 nm to about 2 nm.

14. A method of manufacturing a semiconductor memory device, the method comprising:

forming a bit line extending in a first direction on a substrate;

forming a channel accommodating insulating layer on the substrate to define a channel trench, wherein the channel trench exposes at least a portion of the bit line and extending in a second direction crossing the first direction;

stacking an oxide semiconductor layer on the substrate and the channel accommodating insulating layer;

stacking a first graphene layer on the oxide semiconductor layer;

forming a photoresist film on the first graphene layer;

forming a channel layer by etching the first graphene layer and the oxide semiconductor layer by using the photoresist film as a mask;

exposing the first graphene layer of the channel layer by removing the photoresist film;

forming a word line extending in the second direction;

forming a gate insulating layer positioned between the channel layer and the word line; and forming a capacitor structure positioned on the channel layer and electrically connected to the channel layer, wherein, in a stacking direction perpendicular to the first direction, a portion of the first graphene layer is stacked on a portion of the oxide semiconductor layer which is stacked on a portion of the bit line.

15. The method of claim 14, further comprising:

stacking a second graphene layer on the substrate and the channel accommodating insulating layer, wherein the oxide semiconductor layer is stacked on the second graphene layer, wherein the forming of the channel layer further includes etching the second graphene layer, and wherein the second graphene layer is in contact with the bit line.

16. The method of claim 15, wherein:

the oxide semiconductor layer includes amorphous indium gallium zinc oxide (IGZO).

17. The method of claim 15, wherein:

a thickness of each of the first and second graphene layers is about 0.3 nm to about 2 nm.

18. The method of claim 14, wherein:

a first surface of the oxide semiconductor layer is in physical contact with the bit line, and a second surface opposite to the first surface of the oxide semiconductor layer is in physical contact with the first graphene layer.

19. The method of claim 14, wherein:

the oxide semiconductor layer includes amorphous indium gallium zinc oxide (IGZO).

20. The method of claim 14, wherein:

a thickness of the first graphene layer is about 0.3 nm to about 2 nm.

* * * * *